United States Patent [19]

Krulik

[11] Patent Number: 4,601,783
[45] Date of Patent: Jul. 22, 1986

[54] HIGH CONCENTRATION SODIUM PERMANGANATE ETCH BATCH AND ITS USE IN DESMEARING AND/OR ETCHING PRINTED CIRCUIT BOARDS

[75] Inventor: Gerald Krulik, LaGuna Hills, Calif.

[73] Assignee: Morton Thiokol, Inc., Chicago, Ill.

[21] Appl. No.: 739,599

[22] Filed: May 31, 1985

[51] Int. Cl.$^4$ .................. B44C 1/22; B29C 17/08; C03C 15/00; C03C 25/06
[52] U.S. Cl. ................... 156/655; 134/22.17; 134/27; 134/29; 156/644; 156/645; 156/668; 156/902; 252/79.5; 252/156; 427/307
[58] Field of Search ............... 156/644, 645, 655, 666, 156/668, 902; 252/79.5, 156; 134/22.1, 22.17, 27, 29; 427/307

[56] References Cited

U.S. PATENT DOCUMENTS

| | | | |
|---|---|---|---|
| 1,969,678 | 8/1934 | White et al. | 41/42 |
| 2,908,557 | 10/1959 | Black et al. | 41/42 |
| 3,293,148 | 12/1966 | Dell et al. | 252/103 |
| 3,425,947 | 2/1969 | Rausch et al. | 252/105 |
| 3,457,107 | 7/1969 | Mickelson et al. | 134/3 |
| 3,489,625 | 1/1970 | Dell et al. | 156/18 |
| 3,506,397 | 4/1970 | Vincent et al. | 23/165 |
| 3,598,630 | 8/1971 | Doty et al. | 117/47 |
| 3,625,758 | 12/1971 | Stahl et al. | 117/212 |
| 3,647,699 | 3/1972 | Doty et al. | 252/79.2 |
| 3,652,351 | 3/1972 | Guisti | 156/2 |
| 3,689,303 | 9/1972 | Maguire et al. | 117/47 A |
| 3,833,414 | 9/1974 | Grisik et al. | 134/3 |
| 4,042,729 | 8/1977 | Polichette et al. | 427/304 |
| 4,054,693 | 10/1977 | Leech et al. | 427/304 |
| 4,073,740 | 2/1978 | Polichette et al. | 252/156 |
| 4,294,651 | 10/1981 | Ohmura | 156/662 |
| 4,425,380 | 1/1984 | Duffy et al. | 427/97 |
| 4,430,154 | 2/1984 | Stahl et al. | 156/651 |

FOREIGN PATENT DOCUMENTS 0109920 5/1984 European Pat. Off. .
1479556 7/1977 United Kingdom .
2134140 8/1984 United Kingdom .

OTHER PUBLICATIONS

Deckert et al., Improved Post-Desmear Process for Multilayer Boards, Printed Circuit World Convention III, WC 111-37, May 22-25, 1984, technical paper, pp. 1-12.
Nuzzi, F. J., "An Improved Permanganate Smear Removal Process," PC FAB, Mar. 1984.
Enthone Incorporated Data Sheet for ENPLATE MLB-497, Feb. 1984.
Latimer, W. M., *The Oxidation States of the Elements and Their Potentials in Aqueous Solution*, Second Edition, pp. 54-62, 78-80 and 238-241.
Cotton, F. A. et al., *Advanced Inorganic Chemistry*, 1962, pp. 694, 699 and 700.
Stewart, R., *Oxidation By Permanganate*, 1965.
Pourbaix, M., *Atlas of Electrochemical Equilibria in Solutions*, pp. 289-292, 551-553, 595-602 and 609-613.
Dekert, C. A.; Couble, E. C.; Bonetti, W. F., "Improved Method for the Elimination of Layer Smearing in Multilayer Circuits," *Galvanotechnik*, vol. 75 (1984), No. 5, pp. 662-672.

Primary Examiner—William A. Powell
Attorney, Agent, or Firm—Richard J. Sheridan; Gerald K. White

[57] ABSTRACT

Aqueous, alkaline, liquid solutions consisting essentially of $NaMnO_4$ and $NaOH$ provide high etch rates for, e.g., printed circuit boards. The solutions can be used to desmear and etchback, and produce manganese residues on the surface of the board which are readily removed by acid neutralization alone.

14 Claims, 1 Drawing Figure

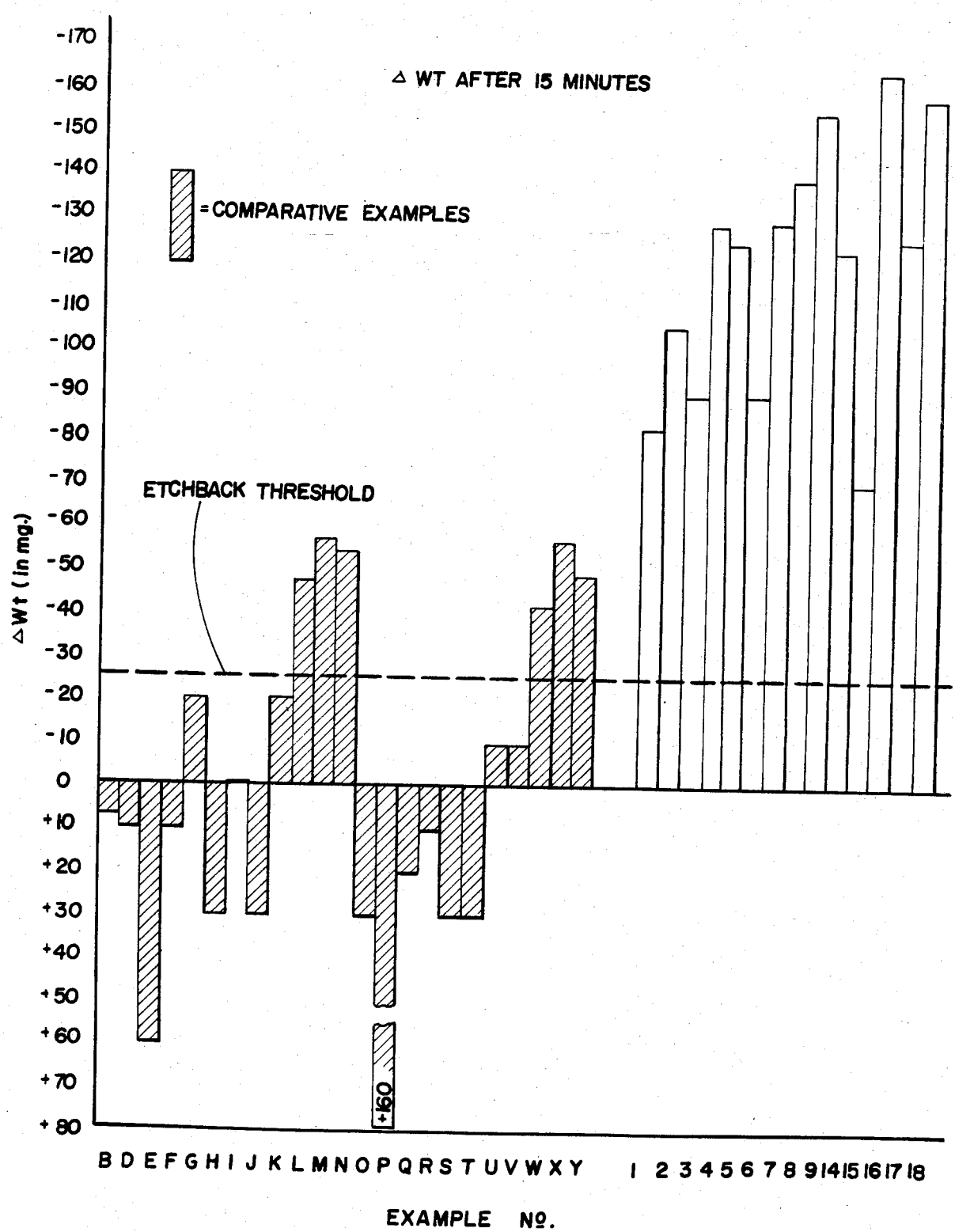

HIGH CONCENTRATION SODIUM PERMANGANATE ETCH BATCH AND ITS USE IN DESMEARING AND/OR ETCHING PRINTED CIRCUIT BOARDS

BACKGROUND OF THE INVENTION

1. Field of the Invention

This invention relates to aqueous, alkaline liquid solutions consisting essentially of water, at least about 75 grams/liter of $NaMnO_4$, and NaOH in an amount sufficient so that the removal of substantially all of the manganese residues from the surface of a material contacted with said solution can be accomplished by acid neutralization only. This invention also relates to a process of removing resin smears on interior walls of holes formed in insulating substances and/or etching the interior walls of such holes using the aqueous, alkaline sodium permanganate solutions of this invention.

2. Description of the Prior Art

Hole forming operations in resin containing materials often result in the smearing of resin over the interior wall or barrel of a hole. This resin smear is primarily attributable to the generation or utilization of temperatures exceeding the melting point of a resinous component of the material during the hole forming process.

Where holes are drilled in epoxy impregnated fiber glass laminate materials (such as those employed to make printed circuit boards), friction of the drill bit against the material raises the temperature of the bit. Often, drill bit temperatures are generated which exceed the melting temperature of many resin systems. The drill bit thus picks up melted resin on its course through the material being drilled, and this melted accretion is smeared in the barrel of the hole. In laser drilling to contact interior conductors in organic insulating substrates, a similar resin accretion or smear can develop on the exposed conductor surface.

While the problem of resin smear on the hole walls may be ignored in some applications, it is at times imperative that it be removed. For example, when a multilayer circuit board is made, holes are formed in a resin-containing material which includes a plurality of parallel planar metallic conductors, with the hole perpendicular to, and communicating with, two or more parallel metallic conductors. It is often desired to metallize the hole walls in order to form a conductive path between two or more of the metallic conductors, so the resin smear must be removed from the edges of the hole through the metallic conductors if conductive contact between the metallized hole wall and the metallic conductors is to be achieved. Thus, when circuit board holes are drilled through a copper clad base plastic laminate or through a plastic laminate containing internal conductor planes such as in a multilayer circuit board, resin smear on the metallic surfaces exposed to the walls of the holes must be removed to achieve proper functioning of the plated through-holes.

Plated through-holes as described above are useful as electrical connections between printed circuits having metallic conductors on both sides of the plastic laminate or between two or more of the various planes and surface conductor layers in multilayer boards. The electrical and mechanical integrity required for this function can only be attained by insuring complete removal of resinous materials from the entire inner circumference of the portion of the metallic conductor exposed by the hole.

Numerous methods are known for removing resin smear. One approach is a mechanical one and involves channeling a dry or wet stream of abrasive particles through such holes. A similar method is the use of hydraulic pressure to force a thick slurry of abrasive material through the holes. However, these mechanical methods are generally slow and difficult to control. Furthermore, complete removal or smear in all holes in a given circuit board is difficult to achieve.

Chemical methods have also been used to desmear holes. Generally, the chemicals used attack the smeared resinous coating. The chemicals include, for example, concentrated sulfuric acid (down to about 90 percent concentration). Smeared epoxy resin, which is usually less than about 0.001 inch thick, can be removed with about one minute's treatment with concentrated sulfuric acid. Unfortunately, the high sulfuric acid concentration required is very hazardous and requires extraordinary precautions by operators. Also, undesirably rough holes are produced. In addition, the concentrated sulfuric acid rapidly absorbs water, which limits its useful life span and can cause variations in the immersion times required to desmear the holes.

Another chemical smear removal agent which has been employed is chromic acid. While it is easier to control etch rates with chromic acid because it is a slower etchant that concentrated sulfuric acid, it still requires operator caution and special equipment. Chromic acid also presents toxicity and waste disposal problems.

Permanganate has also been used for smear removal and for etching of various materials. For example, U.S. Pat. No. 1,969,678, issued Aug. 7, 1934 to White et al. discloses etching solutions for metals, e.g. copper, which contain ferric chloride and an oxidizer which converts ferrous ions to ferric ions. This oxidizer may be $KMnO_4$. Of course, these etching solutions would have at best limited utility in preparing circuit boards since the boards often contain a copper layer which would be subject to removal by the ferric chloride.

U.S. Pat. No. 3,293,148, issued Dec. 20, 1966 to Dell et al., discloses a cleaning solution for metals which contains an oxidizer, alkali metal hydroxide, gluconic acid and polyethylene glycol. Among the many oxidizers disclosed are permanganates, although they are not preferred and no example is given employing them.

U.S. Pat. No. 3,425,947, issued Feb. 4, 1969 to Rausch et al., relates to solid concentrates useful in preparing treatment baths for removing organic substances from metal surfaces. The concentrates contain about 50–90% alkali metal hydroxide, 10–50% permanganate and 1 gram equivalent/gram mole of permanganate of a reducing agent. Typical solutions prepared by the solid concentrates contain about 105 g/l of $KMnO_4$ (which is completely soluble only at elevated temperature) and about 250 g/l NaOH.

U.S. Pat. No. 3,457,107, issued July 22, 1969 to Mickelson et al., discloses compositions for chemically polishing stainless steel. These compositions are aqueous solutions containing alkali metal hydroxides, e.g. NaOH, and alkali metal permanganate, e.g. $KMnO_4$. Typical solutions contain about 39 g/l NaOH, 16 g/l $KMnO_4$ and 4.8 g/l $Na_2CO_3$; or 78 g/l NaOH, 32 g/l $KMnO_4$ and 9.6 g/l $Na_2CO_3$.

U.S. Pat. No. 3,489,625, issued Jan. 13, 1970 to Dell et al., discloses acid pickling of carbon steel followed by treatment with an alkaline permanganate solution. The alkaline permanganate solution contains about 5-50 g/l $KMnO_4$ and about 10-200 g/l alkali metal hydroxide.

U.S. Pat. No. 3,506,397, issued Apr. 14, 1970 to Vincent et al., relates to the treatment of ABS resin with a composition containing phosphoric acid and potassium permanganate.

U.S. Pat. No. 3,598,630 and 3,647,699, issued respectively on Aug. 10, 1971 and Mar. 7, 1972 to Doty et al., are also related to phosphoric acid/potassium permanganate solutions for treating ABS polymers.

U.S. Pat. No. 3,625,758, issued Dec. 7, 1971 to Stahl et al., deals with the manufacture of printed circuit boards. As one step in the manufacturing process, the board is treated with an oxidization and degradating agent which may be a permanganate solution. However, no details or specific examples regarding the composition of the permanganate solution are provided.

U.S. Pat. No. 3,652,351, issued Mar. 28, 1972 to Guisti, discloses compositions for etching synthetic polymers. These etchant compositions contain 2.5-8.5% potassium and/or sodium manganate, 30-70% sodium and/or potassium hydroxide and 21.5-67.5% water. These compositions are prepared from the corresponding permanganate which is reacted with a large amount of sodium and/or potassium hydroxide at elevated temperature to reduce the permanganate to manganate. For instance, in Example 1 Guisti combines 50 g KOH, 5 g $KMnO_4$ and 20 g water and heats the resulting mixture at 80°-90° C. until the deoxidation reaction is complete. Likewise, in Example 2 the reaction mixture contains 45 g NaOH, 6 g $NaMnO_4$ and 20 g water, and Example 3 employs 25 g NaOH, 25 g $KMnO_4$, 2.5 g $NaMnO_4$ and 20 g water.

Attempts were made to duplicate Guisti's examples and it was found that the permanganate-containing reaction mixtures were not liquid solutions but rather paste-like materials which crystallized even at boiling temperatures. This is perhaps not surprising, however, since the reaction mixtures contain vast quantities of alkali metal hydroxide. More particularly, the reaction mixture for Example 1 contains (on a grams/liter basis) 1000 g/l KOH and 105 g/l $KMnO_4$; Example 2 uses 990 g/l NaOH and 132 g/l $NaMnO_4$; and Example 3 uses 575 g/l NaOH, 575 g/l KOH, 108 g/l $NaMnO_4$ and 108 g/l $KMnO_4$. Finally, it was found that the manganate compositions produced by duplicating Guisti's examples were not satisfactory etchants.

U.S. Pat. No. 3,833,414, issued Sept. 3, 1974 to Grisik et al., discloses a method for removal of aluminide coatings from metal by treating the metal with a mixed acid solution, followed by treatment with an alkaline permanganate aqueous solution, and finally a second treatment with the mixed acid. The alkaline permanganate aqueous solution contains 8-11% NaOH, 8-11% $Na_2CO_3$ and 4-6% $KMnO_4$.

U.S. Pat. Nos. 4,042,729; 4,054,693 and 4,073,740, issued respectively on Aug. 16, 1977; Oct. 18, 1977 and Feb. 14, 1978 to Polichette et al., relate to treating resinous surfaces with a solution of manganate ($MnO_4{}^{2-}$) and permangante ($MnO_4-$) where the molar ratio of manganate/permanganate is up to 1.2 and the pH of the solution is 11-13. Polichette et al. teach that higher pH increases the $MnO_4{}^{2-}/Mn_4{}^-$ ratio, which is undesirable.

U.S. Pat. No. 4,294,651, issued Oct. 13, 1981 to Ohmura, discloses etching of a semiconductor substrate with a composition containing a fluorine compound (7-38%), an oxidizing agent such as $KMnO_4$ (2.5-7%) and alkali such as KOH or NaOH (1-10%).

U.S. Pat. No. 4,425,380, issued Jan. 10, 1984 to Duffy et al., discloses a process for removing resin smear (desmearing) from a interior wall of a hole in a resinous substrate. The process involves contacting the substrate with an alkaline permanganate solution, having a pH between 11 and 13, at elevated temperature. With regard to the permanganate, it is stated that any metal salt of permanganic acid which is stable and soluble to the extent of at least 10 g/l in water can be employed, sodium permanganate and potassium permanganate being preferred. While it is disclosed that amounts from about 10 g/l up to the limit of solubility of permanganate may be employed, it is emphasized that especially good results are obtained with $NaMnO_4$ or $KMnO_4$ in the range of 10-60 g/l. Further, it is taught that the rate of bonding sites formation increases up to about 60 g/l, but no further increases in rate is noted above this level. Thus, Duffy et al. place a practical upper limit of 60 g/l of permanganate on their desmearing solutions.

The desmearing solutions disclosed by Duffy et al. also have a narrow pH range of 11-13. Duffy et al. state repeatedly that a higher pH leads to an assortment of severe problems. For example, they state at col. 3, lines 2-5 that the use of high pH permanganate solution results in localized inactive areas when used to desmear epoxy resin and etch back polymide in circuit boards. These inactive areas lead to the formation of pin holes or plating voids when the board is subsequently electrolessly plated with metal. This problem of pin holes and plating voids after cleaning with high pH permanganate solutions is referred to again at col. 3 lines 37-40.

Duffy et al. point to other problems caused by high pH, i.e. above pH13, permanganate solutions. At col. 4, lines 27-29 they state that large amounts of residual manganese are found when alkaline permanganate treating solutions having a pH above 13 are used. They further state at col. 4, lines 31-38 that when these high pH permanganate solutions deposited on a substrate were not neutralized, subsequent electroless metal deposition was rapid but the electroless metal bath spontaneously decomposed. On the other hand, when the high pH permanganate treating solution was neutralized, residues remained on the substrate resulting in voids in the hole when a metal was subsequently electrolessly deposited thereon. Thus, the clear inference from the teachings of Duffy, et al. is that high pH permanganate solutions would be expected to perform poorly, if at all, in a desmearing process, largely due to their inability to provide a substrate which can be electrolessly plated satisfactorily.

The problem of manganese residues deposited on the substrates when high pH permanganate solutions are employed is specifically addressed by Duffy, et al. in their Examples. There, it is demonstrated that when a high pH $KMnO_4$ solution is used relatively large amounts of manganese residue are left on the substrate. According to Duffy et al. these manganese residues can not be removed simply with an acid neutralization step. An additional step involving immersion in an alkaline solution is required to remove substantially all of the manganese residues.

U.S. Pat. No. 4,430,154, issued Feb. 7, 1984 to Stahl et al., relates to a method for removing an adhesive medium from printed circuit boards without corroding the base material or copper conductor on the board by treatment with an alkaline permanganate or chromic acid solution. The alkaline permanganate solution disclosed contains 50 g/l KMnO$_4$ and 50 g/l NaOH.

British Pat. No. 1,479,558 of Kollmorgen Corporation, published on July 13, 1977, also relates to desmearing and etchback of printed circuit boards and wire conductors by treatment with an alkaline permanganate solution containing potassium permanganate, a strong base (e.g. NaOH) and a fluorinated hydrocarbon wetting agent. The solution contains about 10–75 g/l KMnO$_4$ and enough NaOH to achieve a pH of 13–14. Typically, about 40 g/l of NaOH is employed. The desmearing process is conducted at temperatures from about 35°–50° C., it being disclosed that temperatures above 70° C. result in increased permanganate demand in order to maintain the bath composition without yielding any apparent advantage, i.e. the overall process becomes less efficient in terms of permanganate consumption.

Thus, it can be seen from the foregoing that aqueous permanganate solutions are well known for a variety of uses. However, the art has focused almost exclusively upon solutions containing potassium permanganate. Unfortunately, however, KMnO$_4$ has very limited solubility in water, being soluble in water at 20° C. at a maximum of only about 63.8 g/l. Also, even at its saturation point KMnO$_4$ is a relatively slow etchant.

In an effort to improve the etching efficiency of KMnO$_4$ the art has in recent years turned to highly alkaline KMnO$_4$ solutions. In particular, U.S. Pat. No. 4,425,380 and British Pat. No. 1,479,553 discussed above deal with KMnO$_4$ solutions having a pH of 11–13 and 13–14 respectively. While this high alkalinity did appear to confer some benefits upon the KMnO$_4$ solutions, it leads to other problems such as the deposition of manganese residues which are difficult to remove. For this reason, it was believed that KMnO$_4$ solutions having a pH above about 13 would not produce satisfactory etching results (see the above discussion of U.S. Pat. No. 4,425,380).

Increased etching efficiency has also become desirable because in many situations it is necessary that the etchant composition not only be capable of desmearing small areas of resin, but also be capable of "etching back" the resin. The term "etchback" is used in the art to refer to the removal of resin from, for example, the barrel of a hole in a printed circuit board to expose a portion of the layers of copper or the like. In essence then, the copper layer protrudes slightly into the hole in the board. While for practical purposes etchback is any resin removal which is greater than simple desmearing, in some cases rather specific etchback requirements are necessary. (For instance, the military defines etchback, for their purposes, as the removal of 0.3–3.0 mils of resin.) While there is no definitive line between desmearing and etchback, for the purposes of this application, a solution which causes a weight loss in excess of 25 mg. (or approximately 0.05 mil) after 15 minutes of etching a 3 in×3 in epoxy/glass circuit board are considered to cause etchback. Etchant compositions which are capable of removing this much material in a reasonable time without being uncontrollably agressive has been difficult to find.

It has now been discovered that many of the problems encountered with the prior art KMnO$_4$ solutions can be overcome completely with aqueous alkaline solutions of NaMnO$_4$ and NaOH. The NaMnO$_4$ is vastly more soluble in water than is KMnO$_4$, easily producing aqueous solutions containing 400–500 g/l NaMnO$_4$ at 20° C. Also, while the art teaches away from high pH solutions, it has now been found that highly alkaline solutions of NaMnO$_4$ and NaOH actually solve many of the problems which the prior art teaches with high pH KMnO$_4$ solutions. Desmearing and etch rates found with alkaline NaMnO$_4$/NaOH solutions are much faster than with KMnO$_4$ solutions, and while manganese deposits still occur with NaMnO$_4$/NaOH solutions, the deposits are readily removed with a simple acid neutralization, as opposed to the far more complicated treatment required with KMnO$_4$ solutions. Furthermore, these NaMnO$_4$/NaOH solutions provide excellent, readily controlled etchback.

SUMMARY OF THE INVENTION

The present invention provides an aqueous, alkaline liquid solution consisting essentially of water, at least about 75 grams/liter (g/l) of NaMnO$_4$ and NaOH in an amount sufficient so that the removal of substantially all of the manganese residues from the surface of a material contacted with said solution can be accomplished by acid neutralization only. The solution is useful for preparing a resinous substrate for subsequent metallization.

The present invention also provides a process for preparing a resinous substrate for subsequent metallization which comprises contacting said substrate with an aqueous, alkaline liquid solution consisting essentially of water, at least about 75 g/l of NaMnO$_4$ and NaOH in an amount sufficient so that the removal of substantially all of the manganese residues from the surface of a material contacted with said solution can be accomplished by acid neutralization only.

This invention also provides an improved process for desmearing resin from the inside walls of holes formed in resinous substrates wherein the improvement comprises contacting the substrate with an aqueous, alkaline liquid solution consisting essentially of water, at least about 75 g/l of NaMnO$_4$ and NaOH in an amount sufficient so that the removal of substantially all of the manganese residues from the surface of a material contacted with said solution can be accomplished by acid neutralization only.

Also provided by this invention is an improved hole cleaning process for multilayer circuit boards wherein the improvement comprises contacting the multilayer circuit board with an aqueous, alkaline liquid solution consisting essentially of water, at least about 75 g/l of NaMnO$_4$ and NaOH in an amount sufficient so that the removal of substantially all of the manganese residues from the surface of a material contacted with said solution can be accomplished by acid neutralization only.

Further provided by the present invention is a process for etching back the surface of a circuit board, especially the walls of holes therein, which comprises contacting the circuit board with an aqueous, alkaline liquid solution consisting essentially of water, at least about 75 g/l of NaMnO$_4$ and NaOH in an amount sufficient so that the removal of substantially all of the manganese residues from the surface of a material contacted with said solution can be accomplished by acid neutralization only.

BRIEF DESCRIPTION OF THE DRAWING

The sole FIGURE is a graphical presentation of the weight change data from some of the examples which follow.

DETAILED DESCRIPTION OF THE PREFERRED EMBODIMENTS

The aqueous alkaline solutions of the present invention contain $NaMnO_4$ and NaOH. Both components are used at relatively high levels, e.g. from about 75 g/l to about 400 g/l of $NaMnO_4$ and at least about 40 g/l of NaOH.

When the term "grams/liter" is used with respect to the solutions of this invention, it refers to the amount of the particular component which is in solution at room temperature, i.e. about 25° C.

It should be emphasized that while the prior art treats $NaMnO_4$ and $KMnO_4$ as being equivalent and providing similar or equal desmearing or etching performance, the two are not, in fact, equivalent. $KMnO_4$ has a very limited solubility in water, i.e. a maximum of about 63.8 g/l at 20° C. However, NaMnO has a much greater solubility in water, aqueous solutions of 400–500 g/l of $NaMnO_4$ being readily made. It has now been discovered that these more highly concentrated $NaMnO_4$ solutions provide etch rates which are significantly higher than those which can be achieved with $KMnO_4$.

Likewise, it has been found that etch rate is dependent upon the caustic concentration in the solution. Low caustic levels, e.g. up to about 4 g/l NaOH, yield low etch rates even at high permanganate concentrations. Furthermore, at low caustic concentrations $MnO_2$ builds up on the surface of the material which is being etched, this $MnO_2$ being extremely difficult (if not impossible) to remove completely. As the concentration of caustic is raised, etch rate increases, but the deposit on $MnO_2$ on the etched surface is still difficult to remove. This problem is discussed at length in U.S. Pat. No. 4,425,380 to Duffy et al. which relates to desmearing processes using $KMnO_4$ and caustic concentrations up to about 40 g/l. At their caustic concentrations Duffy et al. require a two step process to adequately remove the manganese residue on the surface of, e.g., a circuit board. The residue must first be neutralized with an acid solution to reduce the manganese residues to a low oxidation state. However, this neutralization step alone is insufficient to remove all of the deposited manganese left by the Duffy et al. $KMnO_4$ solution. This neutralization step must be followed by treatment with an alkaline hydroxide solution at about 40°–95° C. in order to remove essentially all of the manganese residues.

It has now been quite unexpectedly discovered that an aqueous alkaline liquid solution containing at least about 75 g/l of $NaMnO_4$ and at least about 40 g/l of NaOH produces a manganese residue which is quite easily removed by a simple acid neutralizing process such as contacting the surface on which the manganese residue is deposited with dilute sulfuric acid. No subsequent treatment, such as that required by Duffy et al., is necessary. This is especially surprising in view of the fact that, until this invention was made, it was believed by those skilled in the art that higher caustic concentrations would not solve the problem of manganese residue removal.

The amounts of $NaMnO_4$ and NaOH is the solutions of this invention may vary substantially, it being required only that the solution contain certain minimum amounts of each compound. For $NaMnO_4$ this minimum amount is about 75 g/l, i.e. 75 grams of $NaMnO_4$ per liter of the final aqueous alkaline liquid solution. Amounts of $NaMnO_4$ less than about 75 g/l do not provide solutions which have the desired high etch rates of the solutions of the present invention. The maximum amount of $NaMnO_4$ is determined only by its solubility limit in the solution, i.e. solutions containing $NaMnO_4$ up to its saturation point are useful in this invention. However, solutions according to this invention which contain above about 400 g/l of $NaMnO_4$ are very aggressive etchants and may produce rough surfaces on some etched materials. Thus, for practical reasons, the maximum amount of $NaMnO_4$ in the solutions of this invention is about 400 g/l. Preferably, the amount of $NaMnO_4$ will be from about 100–200 g/l. Solutions containing this preferred amount of $NaMnO_4$ provide excellent etch rates and are economically practical. When the material to be etched is an epoxy resin, as is normally found in printed circuit boards, an amount of $NaMnO_4$ of about 160 g/l is especially preferred.

The amount of NaOH in the solutions of this invention may also vary widely In general, it is necessary only that the solution contain sufficient NaOH that the removal of substantially all of the manganese residues from the surface of the material contacted with the solution can be accomplished readily, e.g. by acid neutralization only. Normally, this amount will be at least about 40 g/l of NaOH. As with $NaMnO_4$, the maximum amount of NaOH is determined only by its solubility limit in the solution, which will, of course, depend upon the amount of $NaMnO_4$ dissolved in the solution. While solutions which are saturated with NaOH are useful in this invention, as with $NaMnO_4$ practical considerations dictate a maximum of about 400 g/l of NaOH in the solution. Preferred amounts of NaOH range from about 40–160 g/l. When the material to be etched is an epoxy resin, about 60 g/l of NaOH is especially preferred.

From the foregoing, it can be seen that the preferred solutions of this invention contain about 100–200 g/l of $NaMnO_4$ and 40–160 g/l of NaOH, and, when epoxy resin is etched, about 160 g/l of $NaMnO_4$ and about 60 g/l of NaOH.

The solutions of this invention may be prepared quite easily. Basically, the $NaMnO_4$ and NaOH are simply dissolved in water in amounts sufficient to achieve the desired concentration of each component. The $NaMnO_4$ and NaOH may be either solid or in the form of highly concentrated aqueous solutions, the latter being somewhat preferred to avoid overheating of the solution as it is made.

The solutions of the present invention are especially useful in processes which prepare resinous substrates for metallization, for desmearing resin from the inside walls of holes formed in resinous substrates, for hole cleaning processes for multilayer circuit boards and for etch back processes for circuit boards. The present invention includes such processes which employ the aqueous alkaline solutions of this invention.

The processes of this invention may be practiced in the manner well known in the (such as that disclosed in U.S. Pat. No. 4,425,380 and British Pat. No. 1,479,558 which are hereby incorporated by reference herein) art using the etchant solutions of this invention to desmear, etchback or both. Thus, the processes of this invention may be carried out in the following typical manner which is described with respect to the processing of a printed circuit board (PCB):

1. The PCB is precleaned before etching with the $NaMnO_4$/NaOH solution. This is to remove excess oils or dirt, to uniformly wet the resin and/or metal surfaces, and to optionally soften the resin slightly with an organic solvent for ease of permanganate attack.

2. The cleaned PCB is rinsed to remove the cleaning solution of step 1.

3. The PCB is then placed in a NaMnO$_4$/NaOH solution in accordance with this invention for a time and at a temperature sufficient to effect the desired resin removal. The actual conditions employed will vary with the type of etching desired (e.g. desmearing may require only 1–5 minutes; etchback may require 5–60 minutes or more at a typical bath temperature of about 170° F.) and type resin.

4. The PCB is thoroughly rinsed.

5. The PCB is then contacted with an acid neutralization solution (e.g. dilute sulfuric acid and a mild reducing agent) to remove essentially all of the permanganate and manganese (principally manganese dioxide) residues from the PCB.

5. The board is removed from the solution and placed in an acid neutralization solution, e.g. an aqueous acid solution containing 5% H$_2$SO$_4$ and 50 g/l reducing agent.

6. The board is removed from the neutralizer, baked at 100° C. until completely dry and weighed again.

7. Total weight loss (or gain) is determined by comparing the weight of the board at step 3 and step 6. The change in weight is indicated in the following examples as "Δwt" and indicates the amount of material etched from the board (or weight added to the board) by the permanganate solution.

COMPARATIVE EXAMPLES

Several tests were conducted to determine the ability of KMnO$_4$ solutions to desmear and/or etch back circuit boards. The results are indicated in Table A (Comparison).

TABLE A
(Comparison)

| Comp. Ex. | KMnO$_4$ (g/l) | NaOH (g/l) | Time (Min.) | Temp (°F.) | Δ Wt |
|---|---|---|---|---|---|
| A* | 48 | 1.6 | 5 | 145–152 | +0.0058 |
| B* | " | " | 15 | " | +0.0070 |
| C* | " | " | 30 | " | +0.0053 |
| D | 20 | 1 | 5/15 | 160 | −0.02/+0.01** |
| E | 50 | 1 | " | 185 | +0.01/+0.06 |
| F | 20 | 101 | " | 185 | −0.01/+0.01 |
| G | 50 | 101 | " | 160 | −0.01/−0.02 |
| H | 20 | 1 | " | 185 | +0.03/+0.03 |
| I | 50 | 1 | " | 160 | 0/0 |
| J | 20 | 101 | " | 160 | +0.01/+0.03 |
| K | 50 | 101 | " | 185 | +0.01/−0.02 |
| L | 42 | 83 | 15 | 170 | −0.0468 |
| M | 49 | 115 | " | " | −0.0573 |
| N | 56 | 147 | " | " | −0.0489 |

*Commercial product sold by M & T Chemicals, Inc.
**The first Δ wt is after 5 mins.; the second Δ wt is after 15 mins.

6. The PCB is rinsed again thoroughly.

In the following examples, various permanganate-containing solutions are tested to determine their usefulness as desmearing or etch back baths. For each test, the following procedure was followed:

1. A circuit board having copper clad on both sides of an epoxy resin/fiber glass substrate is cut to a 3"×3" size.

2. The copper is etched completely from both sides of the board using a standard copper etching bath, e.g. a H$_2$O$_2$/H$_2$SO$_4$ solution.

3. The resulting board is baked at 100° C. until completely dry and then weighed.

4. The board is then placed in the solution indicated in the following examples, at the temperature and for the length of time also indicated in the examples.

Several more tests were conducted to determine the efficiency of solutions containing relatively low concentrations of NaMn$_4$. The results are tabulated in Table B (Conmparison).

TABLE B
(Comparison)

| Comp. Ex. | NaMnO$_4$ (g/l) | NaOH (g/l) | Time (Min.) | Temp (°F.) | Δ Wt. |
|---|---|---|---|---|---|
| O | 20 | 1 | 5/15 | 160 | +0.02/+0.03 |
| P | 50 | 1 | " | 185 | +0.05/+0.16 |
| Q | 20 | 101 | " | 185 | +0.03/+0.02 |
| R | 50 | 101 | " | 160 | +0.02/+0.01 |
| S | 20 | 1 | " | 185 | +0.02/+0.03 |
| T | 50 | 1 | " | 160 | +0.03/+0.03 |
| U | 20 | 101 | " | 160 | 0/−0.01 |
| V | 50 | 101 | " | 185 | 0/−0.01 |
| W | 45 | 78 | 15 | 170 | −0.0415 |
| X | 55 | 106 | " | " | −0.0561 |
| Y | 65 | 134 | " | " | −0.0477 |

The data in Tables A and B demonstrate that KMnO$_4$ solutions have only limited effectiveness as desmearing solutions and are generally not useful as etch back solutions due to the very low amount (if any) of resin removed. Even at very high concentrations of KMnO$_4$ and NaOH, a weight loss of only 0.0573 grams was achieved (Comp. Ex. M). At lower concentrations the weight loss was negligible at best. Also, in many cases, the board actually showed a weight gain. This was due to mangnese residues which were deposited on the surface of the board and could not be removed using the acid neutralization alone.

Aqueous, alkaline liquid solutions according to this invention were tested by the same method used in the Comparative Examples. The results are summarized to Table 1.

TABLE 1

| Ex. No. | NaMnO$_4$ (g/l) | NaOH (g/l) | Time (Min.) | Temp (°F.) | Δ Wt. |
|---|---|---|---|---|---|
| 1 | 148 | 129 | 15 | 170 | −0.0875 |
| 2 | 158 | 133 | " | " | −0.1066 |
| 3 | 168 | 137 | " | " | −0.0900 |
| 4 | 178 | 141 | " | " | −0.1291 |
| 5 | 188 | 145 | " | " | −0.1253 |
| 6 | 198 | 149 | " | " | −0.0912 |
| 7 | 407 | 338 | " | " | −0.1306 |
| 8 | 192 | 127 | " | " | −0.1415 |
| 9 | 163 | 135 | " | " | −0.1548 |
| 10 | 86 | 81 | 11 | 170 | −0.0395 |
| 11 | 98 | 86 | 12 | " | −0.0641 |
| 12 | 110 | 92 | 13 | " | −0.0782 |
| 13 | 121 | 98 | 14 | " | −0.0870 |
| 14 | 133 | 104 | 15 | " | −0.1238 |
| 15 | 113 | 100 | 15 | 170 | −0.0717 |
| 16 | 163 | 100 | " | " | −0.1655 |
| 17 | 113 | 150 | " | " | −0.1265 |
| 18 | 163 | 150 | " | " | −0.1583 |

The data in Table 1 clearly demonstrates the unexpected superiority of the aqueous alkaline NaMnO$_4$ solutions of the present invention. First, it is evident that solutions of NaMnO$_4$ can be prepared containing at least about 400 g/l NaMnO$_4$ and about 350 g/l NaOH. It is also clear that the solutions of this invention are vastly more active etchants than are those of the Comparative Examples. Even the least concentrated solution of this invention (Ex. No. 10) removed nearly as much material from the board in only 11 minutes as did the most concentrated comparative solution (Comp. Ex. M) in 15 minutes. Furthermore, all of the solutions tested in Table 1 were well above the desmear/etch back threshold. It is also highly significant that all of the boards etched with the solutions of this invention had essentially all of the magnanese residue on them removed by the acid neutralization only.

Some of the data from Comparative Tables A and B and Table 1 is summarized graphically in the FIGURE. There, the Δwt for those examples wherein the circuit board was subjected to a 15 minute etch is shown. Quite evidently, the solutions of this invention are vastly superior to the Comparative solutions. All of the solutions of this invention provided a weight loss far in excess of any of the comparative solutions. In addition, all of the solutions of this invention exceeded the etchback threshold of 25 mg (represented by the horizontal broken line in the FIGURE) by a substantial margin, whereas only a few of the comparative solutions were able to exceed it. Finally, more than one-half of the comparative solutions caused a weight gain for the circuit board, indicating that the manganese residues deposited on those boards was not removed by the simple acid neutralization. Clearly, none of the solutions of this invention caused a weight gain.

I claim:

1. An aqueous, alkaline, liquid solution consisting essentially of water, at least about 75 grams/liter of NaMnO$_4$ and NaOH in an amount sufficient so that the removal of substantially all of the manganese residues from the surface of a material contacted with said solution can be accomplished by acid neutralization.

2. A solution according to claim 1 which contains from about 75 g/l to about 400 g/l NaMnO$_4$.

3. A solution according to claim 2 which contains from about 100 g/l to about 200 g/l NaMnO$_4$.

4. A solution according to claim 3 which contains about 160 g/l NaMnO$_4$.

5. A solution according to claim 1 which contains at least about 40 g/l NaOH.

6. A solution according to claim 5 which contains from about 40 g/l to about 400 g/l NaOH.

7. A solution according to claim 6 which contains from about 40 g/l to about 150 g/l NaOH.

8. A solution according to claim 7 which contains about 60 g/l NaOH.

9. A solution according to claim 1 which contains from about 100 g/l to about 200 g/l of NaMnO$_4$, and from about 40 g/l to about 160 g/l NaOH.

10. A solution according to claim 1 which contains about 160 g/l NaMnO$_4$ and about 60 g/l NaOH.

11. A process for preparing a resinous substrate for subsequent metallization which comprises contacting said substrate with an aqueous, alkaline liquid solution consisting essentially of water, at least about 75 g/l of NaMnO$_4$ and NaOH in an amount sufficient so that the removal of substantially all of the manganese residues from the surface of a material contacted with said solution can be accomplished by acid neutralization.

12. An improved process for desmearing resin from the inside walls of holes formed in resinous substrates wherein the improvement comprises contacting the substrate with an aqueous, alkaline liquid solution consisting essentially of water, at least about 75 g/l of NaMnO$_4$ and NaOH in an amount sufficient so that the removal of substantially all of the manganese residues from the surface of a material contacted with said solution can be accomplished by acid neutralization.

13. An improved hole cleaning process for multilayer circuit boards wherein the improvement comprises contacting the multilayer circuit board with an aqueous, alkaline liquid solution consisting essentially of water, at least about 75 g/l of NaMnO$_4$ and NaOH in an amount sufficient so that the removal of substantially all of the manganese residues from the surface of a material contacted with said solution can be accomplished by acid neutralization.

14. A process for etching back the surface of a circuit board which comprises contacting the circuit board with an aqueous, alkaline liquid solution consisting essentially of water, at least about 75 g/l of NaMnO$_4$ and NaOH in an amount sufficient so that the removal of substantially all of the manganese residues from the surface of a material contacted with said solution can be accomplished by acid neutralization.

* * * * *